(12) United States Patent
Kweon et al.

(10) Patent No.: US 9,010,398 B2
(45) Date of Patent: Apr. 21, 2015

(54) CARRIER SUBSTRATE REMOVING APPARATUS, DISPLAY APPARATUS MANUFACTURING SYSTEM, AND METHOD OF MANUFACTURING THE DISPLAY APPARATUS

(71) Applicant: Samsung Display Co., Ltd., Yongin-si, Gyeonggi-Do (KR)

(72) Inventors: Jin-Keon Kweon, Yongin (KR); Kyung-Hoe Heo, Yongin (KR); Ki-Taek Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/786,391

(22) Filed: Mar. 5, 2013

(65) Prior Publication Data
US 2014/0138032 A1 May 22, 2014

(30) Foreign Application Priority Data
Nov. 16, 2012 (KR) .................. 10-2012-0130510

(51) Int. Cl.
| | |
|---|---|
| *B32B 38/10* | (2006.01) |
| *B32B 43/00* | (2006.01) |
| *G02F 1/13* | (2006.01) |
| *H01L 51/00* | (2006.01) |
| *H01L 51/56* | (2006.01) |
| *G02F 1/1333* | (2006.01) |

(52) U.S. Cl.
CPC ........... *B32B 43/006* (2013.01); *B32B 2457/20* (2013.01); *G02F 1/1303* (2013.01); *G02F 1/133305* (2013.01); *G02F 2202/28* (2013.01); *H01L 51/003* (2013.01); *H01L 51/56* (2013.01)

(58) Field of Classification Search
CPC ........... B32B 43/00; B32B 37/00; B65H 1/00
See application file for complete search history.

(56) References Cited

U.S. PATENT DOCUMENTS

| | | | |
|---|---|---|---|
| 2002/0146893 A1 | 10/2002 | Shimoda et al. | |
| 2006/0090319 A1* | 5/2006 | Howe | 29/407.05 |
| 2010/0149638 A1* | 6/2010 | Kashima et al. | 359/500 |
| 2010/0224320 A1* | 9/2010 | Tsai et al. | 156/344 |
| 2011/0139375 A1* | 6/2011 | Yamamoto et al. | 156/712 |
| 2011/0165514 A1* | 7/2011 | Yamazaki | 430/270.1 |
| 2011/0318577 A1* | 12/2011 | Masuda | 428/352 |
| 2012/0028380 A1* | 2/2012 | Takamoto et al. | 438/15 |
| 2012/0170040 A1 | 7/2012 | Park et al. | |

(Continued)

FOREIGN PATENT DOCUMENTS

| | | |
|---|---|---|
| JP | 2012-047732 | 3/2012 |
| KR | 10-0481994 | 3/2005 |

(Continued)

*Primary Examiner* — Philip Tucker
*Assistant Examiner* — Nickolas Harm
(74) *Attorney, Agent, or Firm* — Christie, Parker & Hale, LLP (57) ABSTRACT

A carrier substrate removing apparatus configured to separate a flexible substrate bonded to a carrier substrate includes a carrier substrate holding unit configured to hold the carrier substrate separated from the flexible substrate; an inclined separation unit configured, with the carrier substrate holding unit, to separate the flexible substrate from the carrier substrate and to transport the flexible substrate at an angle; and a transmittance measuring unit configured to measure a transmittance of the separated carrier substrate.

13 Claims, 8 Drawing Sheets

(56) References Cited

U.S. PATENT DOCUMENTS

2013/0081764 A1* 4/2013 Yamanaka et al. ............ 156/711
2014/0065416 A1* 3/2014 Niwa et al. ............ 428/355 AC

FOREIGN PATENT DOCUMENTS

| KR | 10-2010-0070730 | 6/2010 |
| KR | 10-2012-0077330 | 7/2012 |

* cited by examiner

CARRIER SUBSTRATE REMOVING APPARATUS, DISPLAY APPARATUS MANUFACTURING SYSTEM, AND METHOD OF MANUFACTURING THE DISPLAY APPARATUS

CROSS-REFERENCE TO RELATED PATENT APPLICATION

This application claims priority to and the benefit of Korean Patent Application No. 10-2012-0130510, filed on Nov. 16, 2012, in the Korean Intellectual Property Office, the disclosure of which is incorporated herein in its entirety by reference.

BACKGROUND

1. Field

Embodiments of the present invention relate to a carrier substrate removing apparatus, a display apparatus manufacturing system, and a method of manufacturing a display apparatus.

2. Description of the Related Art

Research is being conducted to develop a display apparatus such as an organic light-emitting display apparatus that is formed to be thin and flexible due to its driving characteristics. Recently, flexible display apparatuses in which a display unit is formed on a flexible substrate having a thickness of about 50 to 100 μm have been highlighted.

However, because it is difficult to handle such a flexible substrate because the flexible substrate is so thin, a carrier substrate formed of a glass material and having a relatively greater thickness than the flexible substrate is generally prepared so that the flexible substrate can be attached thereto, and then, processes such as a display unit forming process may be performed. The flexible substrate and the carrier substrate may later be separated from each other.

Generally, in order to separate the flexible substrate and the carrier substrate from each other, a laser irradiating apparatus irradiates the carrier substrate using a laser beam, and a carrier substrate removing apparatus separates the flexible substrate and the carrier substrate from each other. However, the laser irradiation process may cause defects to occur on the flexible substrate, but the flexible substrate separated from the carrier substrate removing apparatus generally proceeds to post processes (post-processing steps) regardless of whether there are defects, thus unnecessarily consuming processing expenses and time.

SUMMARY

A method of determining defects of the flexible substrate due to over-irradiation of the laser during the separation of the flexible substrate from the carrier substrate is desired.

Embodiments of the present invention present invention provide a carrier substrate removing apparatus capable of improving (e.g., reducing) processing expenses and processing time by rapidly determining the presence of defects in a flexible substrate, a display apparatus manufacturing system, and a method of manufacturing the display apparatus.

According to an aspect of the present invention, there is provided a carrier substrate removing apparatus, the apparatus including: a carrier substrate holding unit configured to hold a carrier substrate after separation from a flexible substrate; an inclined separation unit configured, with the carrier substrate holding unit, to separate the flexible substrate from the carrier substrate and to transport the flexible substrate at an angle; and a transmittance measuring unit configured to measure a transmittance of the separated carrier substrate.

The transmittance measuring unit may include an under vision camera or a color determination digital sensor.

The apparatus may further include a controller configured to compare the transmittance measured by the transmittance measuring unit with a reference transmittance range to determine whether the carrier substrate is normal and to output the determination result.

The controller may be configured to transmit the determination result to a laser irradiation apparatus via a wired communication or a wireless communication channel, the laser irradiation apparatus being configured to irradiate the carrier substrate using a laser beam to separate the carrier substrate and the flexible substrate that are bonded to each other.

The controller may be configured to control an energy density of the laser beam emitted from the laser irradiation apparatus via the wired or wireless communication channel with the laser irradiation apparatus.

The apparatus may further include a carrier substrate loading unit configured to hold the separated carrier substrate.

The carrier substrate holding unit may include: a carrier substrate holding member configured to hold the carrier substrate by suction holding the carrier substrate; and a plurality of transfers connected to the carrier substrate holding member, and configured to transfer the carrier substrate holding member.

The plurality of transfers may include: an X-axis transfer configured to transfer the carrier substrate holding member along an X-axis direction; a Y-axis transfer configured to transfer the carrier substrate holding member along a Y-axis direction; and a Z-axis transfer configured to transfer the carrier substrate holding member along a Z-axis direction.

The apparatus may further include a plurality of ionizers at opposite sides of the inclined separation unit, the ionizers being configured to spray an anti-electrostatic fluid toward opposite sides of the carrier substrate and the flexible substrate.

According to another aspect of the present invention, there is provided a display apparatus manufacturing system including: a laser irradiation apparatus configured to irradiate, using a laser beam, a carrier substrate that is bonded to a flexible substrate; a substrate separation unit configured to separate the carrier substrate from the flexible substrate; a transmittance measuring unit configured to measure a transmittance of the separated carrier substrate; and a controller configured to determine an over-irradiation of the laser beam by using the measured transmittance, and to output the determination result to the laser irradiation apparatus.

The transmittance measuring unit may include an under vision camera or a color determination digital sensor.

The substrate separation unit may include: a carrier substrate holding unit configured to hold the carrier substrate separated from the flexible substrate; and an inclined separation unit configured, with the carrier substrate holding unit, to separate the flexible substrate and the carrier substrate from each other and to transport the flexible substrate.

When the transmittance of the separated carrier substrate is less than a reference value, the controller may be configured to control the laser irradiation apparatus to reduce the energy density of the laser.

According to another aspect of the present invention, there is provided a method of manufacturing a display apparatus, the method including: irradiating, using a laser beam from a laser irradiation apparatus, a carrier substrate to which a flexible substrate is bonded; separating the carrier substrate from the flexible substrate using a carrier substrate removing apparatus; measuring a transmittance of the separated carrier substrate using a transmittance measuring unit; and controlling an energy density of the irradiated (or emitted) laser in accordance the measured transmittance.

The controlling the energy density of the laser may include reducing the energy density of the laser when the transmittance measured by the transmittance measuring unit is less than a reference value.

The carrier substrate may include a glass material, and the flexible substrate comprises a material selected from the group consisting of kapton, polyethersulfone (PES), polycarbonate (PC), polyimide (PI), polyethylene terephthalate (PET), polyethylene naphthalate (PEN), polyacrylate (PAR), and fiber reinforced plastic (FRP).

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

The attached drawings for illustrating exemplary embodiments of the present invention are referred to in order to gain a sufficient understanding of the present invention, the merits thereof, and the objectives accomplished by the implementation of the present invention.

Hereinafter, the present invention will be described in detail by explaining embodiments of the invention with reference to the attached drawings. Like reference numerals in the drawings denote like elements.

Figure 1:
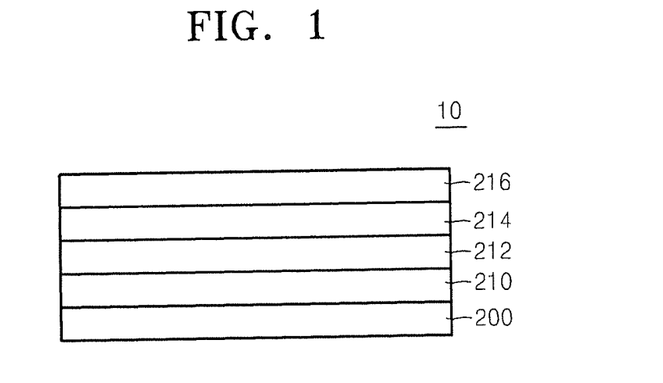
FIG. 1 is a cross-sectional view schematically showing a flexible electronic device attached to a carrier substrate.

FIG. 1 is a schematic cross-sectional view of a flexible electronic device 10 using a carrier substrate 200 according to an embodiment of the present invention.

Referring to FIG. 1, the flexible electronic device 10 includes the carrier substrate 200, a flexible substrate 210, a thin film transistor (TFT) array 212, a display layer 214, and an encapsulation layer 216.

In other embodiments, the flexible electronic device 10 may further include an adhesion layer filling a space between the carrier substrate 200 and the flexible substrate 210 to bond the carrier substrate 200 and the flexible substrate 210 to each other. The adhesion layer may be formed of various materials well known in the art.

The carrier substrate 200 may include a glass material.

The flexible substrate 210 may include a material selected from the group consisting of kapton, polyethersulfone (PES), polycarbonate (PC), polyimide (PI), polyethylene terephthalate (PET), polyethylene naphthalate (PEN), polyacrylate (PAR), and fiber reinforced plastic (FRP).

The display layer 214 may include a liquid crystal layer, an electrophoresis layer, or an organic light emission layer.

Figure 2:
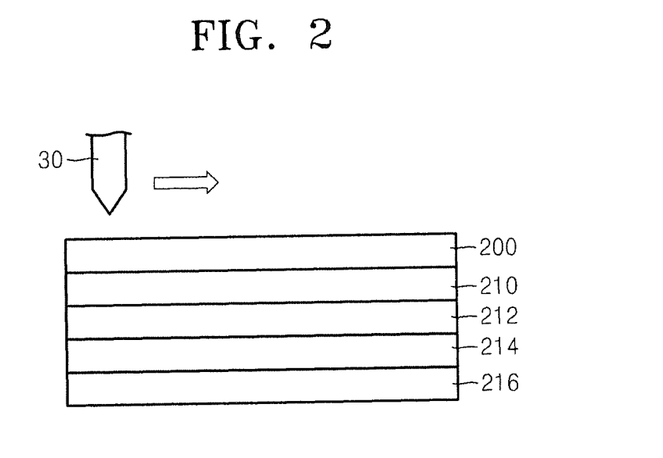
FIG. 2 is a cross-sectional view showing a laser irradiation onto a carrier substrate in order to separate a flexible substrate from the carrier substrate, according to an embodiment of the present invention.
Figure 3:
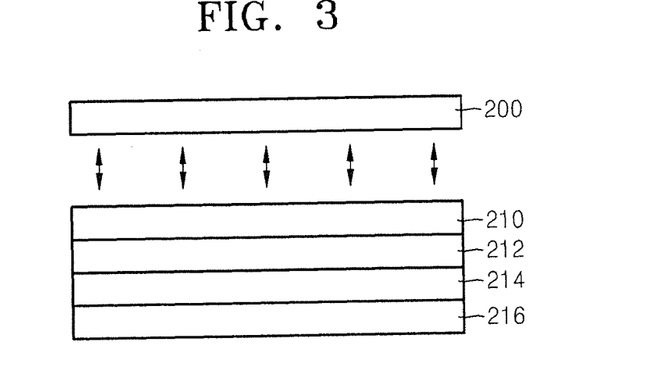
FIG. 3 is a schematic cross-sectional view showing a state where the flexible substrate and the carrier substrate are separated by a carrier substrate removing apparatus according to the embodiment of the present invention shown in FIG. 2.

FIG. 2 is a cross-sectional view showing laser irradiation of the carrier substrate 200 to separate the flexible substrate 210 from the carrier substrate 200, and FIG. 3 is a schematic cross-sectional view showing a state where the flexible substrate 210 and the carrier substrate 200 are separated from each other by using a carrier substrate removing apparatus.

Referring to FIGS. 2 and 3, the carrier substrate 200 is irradiated with a laser beam, and then the carrier substrate 200 and the flexible substrate 210 that were previously bonded to each other may be separated from each other by using the carrier substrate removing apparatus (shown in FIG. 4 as reference numeral 20) that will be described later.

That is, a laser irradiation apparatus 30 irradiates the carrier substrate 200 with a laser beam to facilitate separation of the carrier substrate 200 and the flexible substrate 210 from each other before the carrier substrate removing apparatus separates the carrier substrate 200 and the flexible substrate 210 from each other.

An energy density and a wavelength of the laser beam irradiated (or emitted) from the laser irradiation apparatus 30 may vary depending on a type and a thickness of the adhesion layer. If the carrier substrate 200 is overly irradiated with the laser, the flexible substrate 210 may be damaged and may thus generate defects. In addition, if exfoliation occurs due to over-irradiation of the laser beam before the carrier substrate 200 and the flexible substrate 210 are separated from each other, defects may occur during operation of the carrier substrate removing apparatus, for example, the flexible substrate 210 may crumple on a conveyer of the carrier substrate removing apparatus.

The flexible substrate 210 separated by the carrier substrate removing apparatus proceeds to post processes, for example, a laminate may be formed on the flexible substrate 210, and it is determined whether the carrier substrate 200 is separated or not, and then, the carrier substrate 200 is discarded.

However, the separation check of the carrier substrate 220 may be performed and the carrier substrate 200 may be discarded, without determining (or detecting) whether the flexible substrate 210 is damaged due to the laser over-irradiation, and moreover, a post process may be performed on the damaged flexible substrate 210, thereby incurring unnecessary processing expenses and processing time.

Therefore, according to an embodiment of the present invention, a transmittance of the carrier substrate 200 separated by the carrier substrate removing apparatus is measured, and then, the laser over-irradiation of the laser irradiation apparatus 30 may be rapidly determined (or detected) to improve the processing expenses and the processing time. Hereinafter, a carrier substrate removing apparatus according to an embodiment of the present invention will be described.

Figure 4:
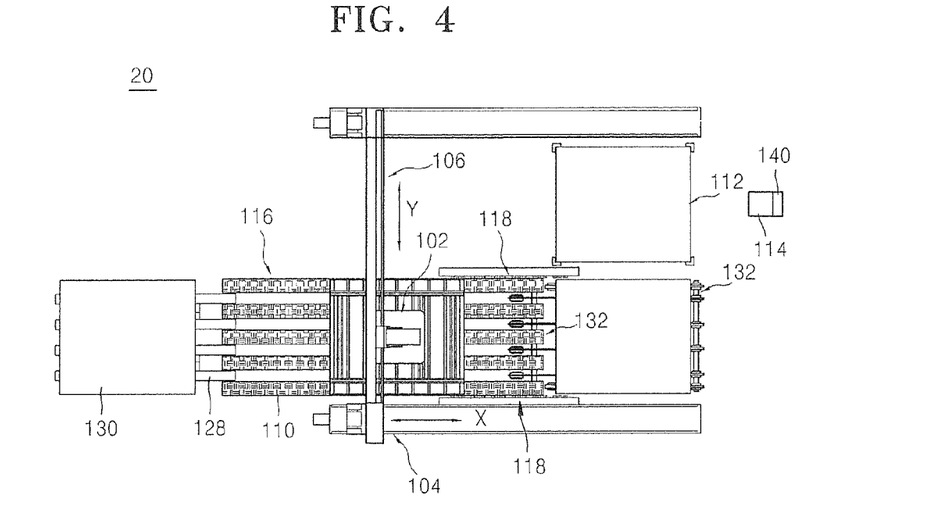
FIG. 4 is a schematic plan view of a carrier substrate removing apparatus according to an embodiment of the present invention.
Figure 5:
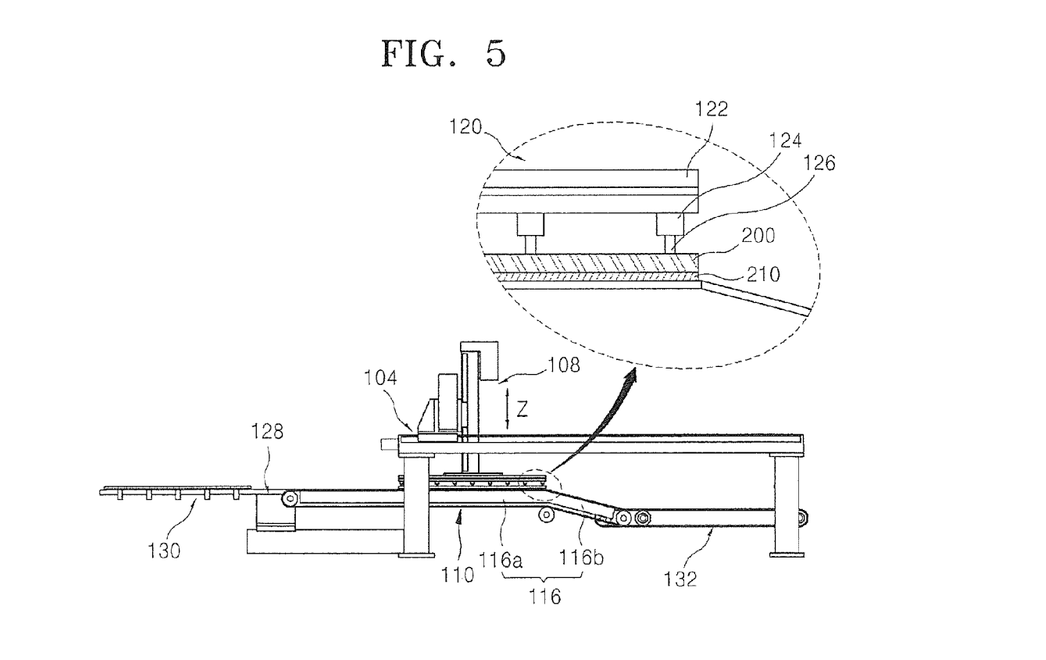
FIG. 5 is a schematic side view of the carrier substrate removing apparatus of FIG. 4.
Figure 6:
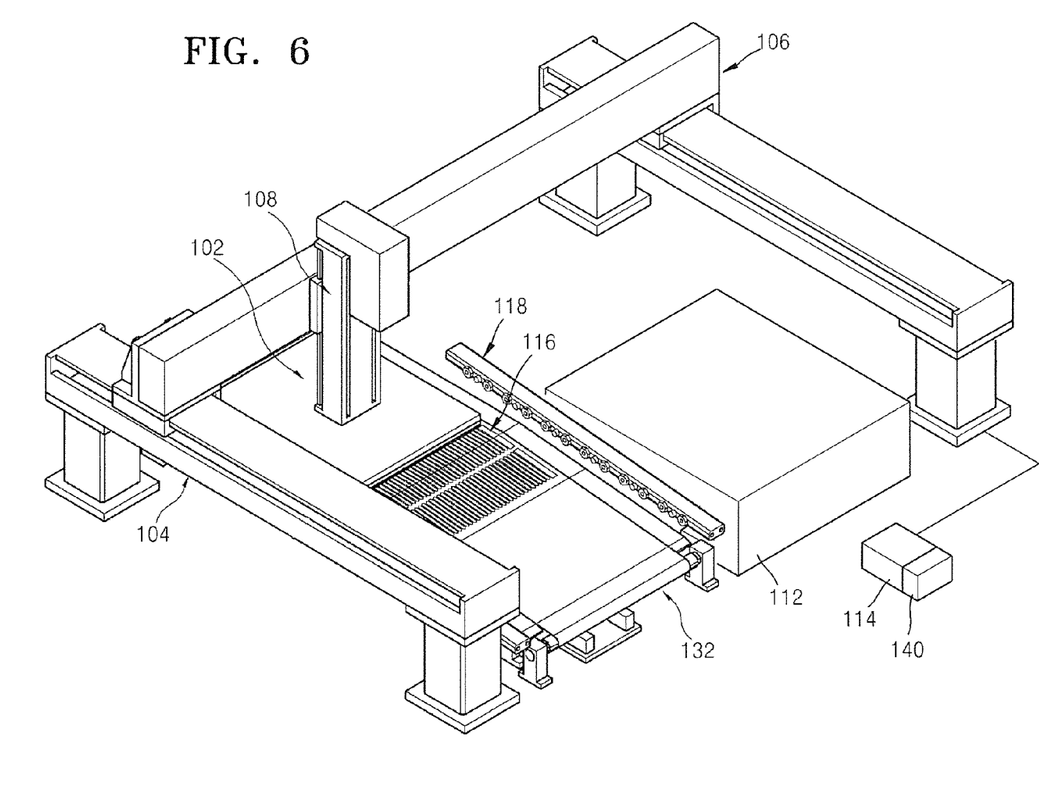
FIG. 6 is a partially enlarged perspective view of the carrier substrate removing apparatus of FIG. 4.

FIG. 4 is a schematic plan view of a carrier substrate removing apparatus 20 according to an embodiment of the present invention, FIG. 5 is a side view of the carrier substrate removing apparatus 20 of FIG. 4, and FIG. 6 is a partially enlarged perspective view of the carrier substrate removing apparatus 20 of FIG. 4.

Referring to FIGS. 4, 5, and 6, the carrier substrate removing apparatus 20 includes a carrier substrate holding unit 102, an inclined separation unit 116, a carrier substrate loading unit 112, and a transmittance measuring unit 114.

Also, the carrier substrate removing apparatus 20 may further include ionizers 118 that are adjacent to the inclined separation unit 116 to spray an anti-electrostatic fluid toward the carrier substrate 200. The ionizers 118 are located at opposite sides of the inclined separation unit 116 to respectively eject the anti-electrostatic fluid to the opposite sides of the carrier substrate 200 and the flexible substrate 210.

The carrier substrate holding unit 102 holds the carrier substrate 200 that constitutes an upper layer on an operation line through which the carrier substrate 200 and the flexible substrate 210 are bonded and conveyed (or transported). The carrier substrate holding unit 102 may hold the carrier substrate 200 using suction holding.

The carrier substrate 200 may be formed of, for example, a glass material; however, embodiments of the present invention are not limited thereto.

The carrier substrate holding unit 102 includes a carrier substrate holding member 120 suctioning and holding the carrier substrate 200, and transfers 104, 106, and 108 that are connected to the carrier substrate holding member 120 to move the carrier substrate holding member 120 in x-axis, y-axis, and z-axis directions, respectively.

The carrier substrate holding member 120 may hold the carrier substrate 200 by using suction holding. As shown in the enlarged view of FIG. 5, the carrier substrate holding member 120 includes a body 122, a plurality of nozzle brackets 124 connected to the body 122, and a plurality of suction nozzles 126 that are respectively coupled to the plurality of nozzle brackets 124 to hold the carrier substrate 200 by a vacuum pressure (e.g., air pressure).

The body 122 may have an area that is equal to or greater than an area of the carrier substrate 200 that is to be held. For example, if the carrier substrate 200 has a size of 2 meters by 2 meters, the body 122 may be fabricated to have a corresponding size.

The plurality of adsorption nozzles 126 are components that vacuum (e.g., supply suction to) the carrier substrate 200, and one adsorption nozzle 126 may be positioned on one corresponding nozzle bracket 124. However, embodiments of the present invention are not limited thereto, and two adsorption nozzles 126 may be positioned on one nozzle bracket 124 in order to hold the carrier substrate 200, which may provide more stability.

The transfers 104, 106, and 108 include an X-axis transfer 104 for transferring the carrier substrate holding member 120 along the X-axis direction (see, e.g., FIG. 4) in which the inclined separation unit 116 is conveyed (or transported), a Y-axis transfer 106 for transferring the carrier substrate holding member 120 along the Y-axis direction (see, e.g., FIG. 4) that crosses the X-axis direction, and a Z-axis transfer 108 for transferring the carrier substrate holding unit 120 in the Z-axis direction (see, e.g., FIG. 5) that is a longitudinal direction with respect to the inclined separation unit 116. The transfers 104, 106, and 108 may be realized by using cylinders or linear motors. However, embodiments of the present invention are not limited thereto.

The inclined separation unit 116 may include a straight section unit 116a and an inclined section unit 116b. The inclined separation unit 116 may convey (or transport) the flexible substrate 210 at an angle (e.g., a predetermined angle) with respect to the carrier substrate 200.

The straight section unit 116a and the inclined section unit 116b may be integrally formed with each other or may be separable components that are combined together. Also, the inclined section unit 116b may be formed at a rear end portion where the carrier substrate 200 and the flexible substrate 210 are separated from each other.

In connection with the suction holding and transporting of the carrier substrate 200 by the carrier substrate holding unit 102, the inclined separation unit 116 transfers the suction held flexible substrate 210 in the inclined direction so that the bonded flexible substrate 210 and the carrier substrate 200 may be separated from each other easily (e.g., relatively easily).

If the velocities of the carrier substrate holding unit 102 and the inclined separation unit 116 are different from each other, the removal of the carrier substrate 200 may not be performed well. Thus, the driving velocities of the carrier substrate holding unit 102 and the inclined separation unit 116 may be synchronized with each other using a driving controller. For example, the driving controller may match the transferring velocity of the inclined separation unit 116 to that of the transfers 104, 106, and 108, or, alternatively, may match the transferring velocities of the transfers 104, 106, and 108 to that of the inclined separation unit 116.

A flexible substrate conveyer 132 that is connected to the inclined separation unit 116 for conveying (or transporting) the flexible substrate 210 that is separated from the carrier substrate 200 is on a rear portion of the inclined separation unit 116.

The carrier substrate loading unit 112 is around (e.g., adjacent) the flexible substrate conveyer 132, and the carrier substrate 200 that is separated from the flexible substrate 210 is loaded on the carrier substrate loading unit 112 (e.g., the carrier substrate loading unit may hold the carrier substrate 200). In addition, FIGS. 4, 5, and 6 show that the carrier substrate loading unit 112 is around (e.g., adjacent) the flexible substrate conveyer 132; however, embodiments of the present invention are not limited thereto, and the carrier substrate loading unit 112 may be within a movable range of the carrier substrate holding member 120 that holds the carrier substrate 200.

A shuttle 128 that moves (or tilts) in an up and down direction (e.g., in the Z-direction) is on a front portion of the inclined separation unit 116, and a pickup unit 130 is in front of the shuttle 128. The bonded carrier substrate 200 and the flexible substrate 210 are on the pickup unit 130 and a laser irradiation apparatus irradiates the carrier substrate 200 using a laser beam. The carrier substrate 200 and the flexible substrate 210 that are bonded to each other may be transferred to the inclined separation unit 116 by the shuttle 128.

The transmittance measuring unit 114 is on a rear portion of the carrier substrate loading unit 112 in order to measure the transmittance of the carrier substrate 200.

It may be determined whether an energy density of the laser beam used to irradiate the carrier substrate 200 is in a normal state by measuring the transmittance of the carrier substrate 200 before the carrier substrate 200 and the flexible substrate 210 are separated by the carrier substrate removing apparatus 20.

The transmittance measuring unit 114 may be, for example, an under vision camera or a color determination digital sensor; however, embodiments of the present invention are not limited thereto.

The under vision camera may extract various colors by using an hue, saturation, and value (HSV) method, and the laser over-irradiation may be determined (or detected) through the color extraction of the separated carrier substrate 200.

The color determination digital sensor may measure the transmittance by measuring an intensity of reflected light after emitting light toward the separated carrier substrate 200 from a light source. That is, if the carrier substrate 200 is overly irradiated by the laser, the carrier substrate 200 may be covered with soot that can be detected by the color determination digital sensor.

If the energy density of the laser irradiated to separate the carrier substrate 200 and the flexible substrate 210 from each other is in the normal range, the transmittance of the carrier substrate 200 measured by the transmittance measuring unit 114 may range from about 82% (536 nm) to about 87% (564 nm).

If the carrier substrate 200 is overly irradiated by the laser, the transmittance of the carrier substrate 200 may be less than about 82% (536 nm or less).

Also, the carrier substrate removing unit 20 may further include a controller 140 that determines (or detects) whether the transmittance measured by the transmittance measuring unit 114 is in the normal state and that outputs the determination result. The controller 140 is at a side of the transmittance measuring unit 114; however, embodiments of the present invention are not limited thereto.

It may be determined whether the measured transmittance is in the normal state or not by comparing the measured transmittance with a range (e.g., a predetermined range or a reference range) of the transmittance, and the determination result may be transmitted to the laser irradiation apparatus via a wired or wireless communication channel.

Also, the controller 140 may control the energy density of the laser via communication with the laser irradiation apparatus (see, e.g., reference numeral 30 of FIG. 2).

Because the carrier substrate removing apparatus 20 includes the transmittance measuring unit 114 to determine (or detect) whether the flexible substrate 210 is defective due to the laser over-irradiation and whether the laser irradiation apparatus (see, e.g., reference numeral 30 of FIG. 2) overly irradiates using the laser, unnecessary post processes may be omitted when the separated flexible substrate 210 has a defect. Moreover, the controller 140 may control the energy density of the laser and thus reduce a defect rate of manufacturing a display apparatus.

FIGS. 7, 8, 9, and 10 are diagrams illustrating sequential operations of the carrier substrate removing apparatus 20 according to an embodiment of the present invention.

Figure 7:
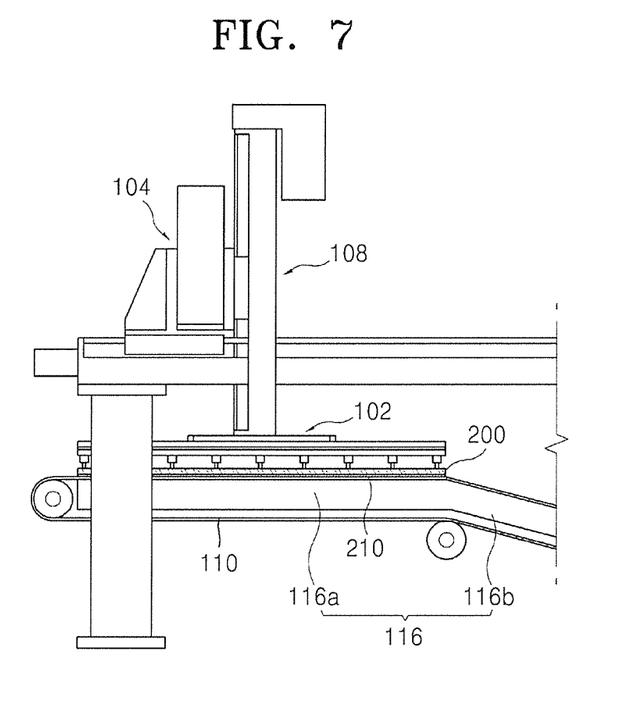
FIGS. 7, 8, 9, and 10 are diagrams sequentially showing operations of the carrier substrate removing apparatus according to an embodiment of the present invention.

Referring to FIG. 7, the flexible substrate 210 that is bonded to the carrier substrate 200 is conveyed (e.g., transported) along the straight (e.g., horizontal) section unit 116*a* of the inclined separation unit 116 in a bonded state.

When the flexible substrate 210 reaches an operating location where the carrier substrate 200 is to be removed, the carrier substrate holding unit 102 is driven by the transfers 104, 106, and 108, and the carrier substrate holding unit 102 holds the carrier substrate 200 using suction holding.

Figure 8:
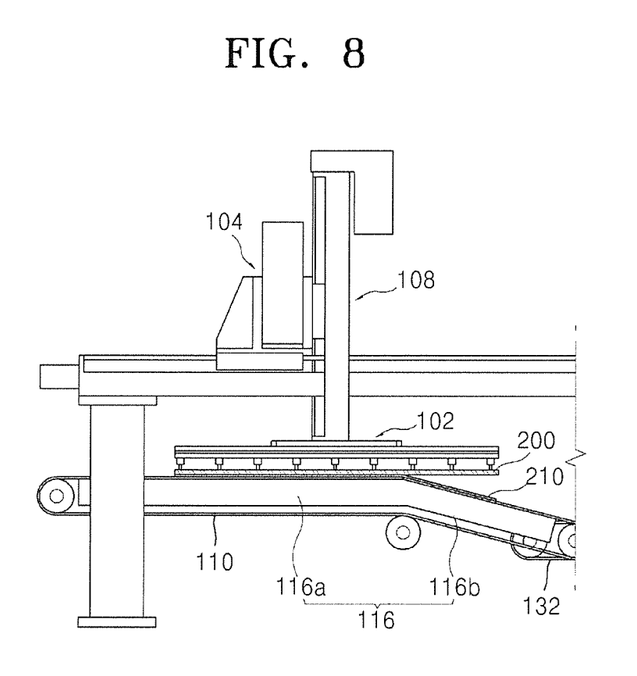

Referring to FIG. 8, in a state where the carrier substrate holding unit 102 holding the carrier substrate 200 is moved in a horizontal direction along with the inclined separation unit 116, the flexible substrate 210 is moved on the flexible substrate conveyer 110 along the inclined section unit 116*b*. As such, the carrier substrate 200 starts to be separated from the flexible substrate 210.

Figure 9:
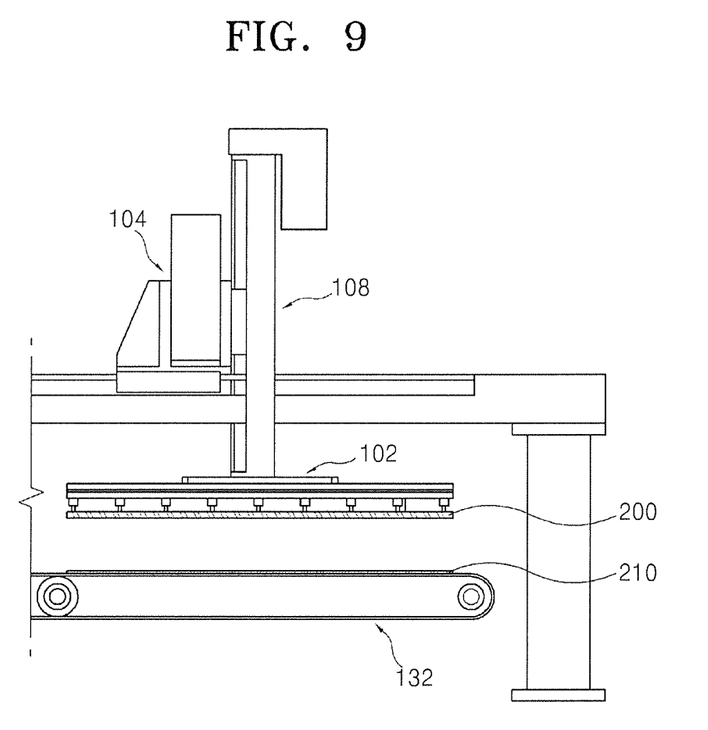
Figure 10:
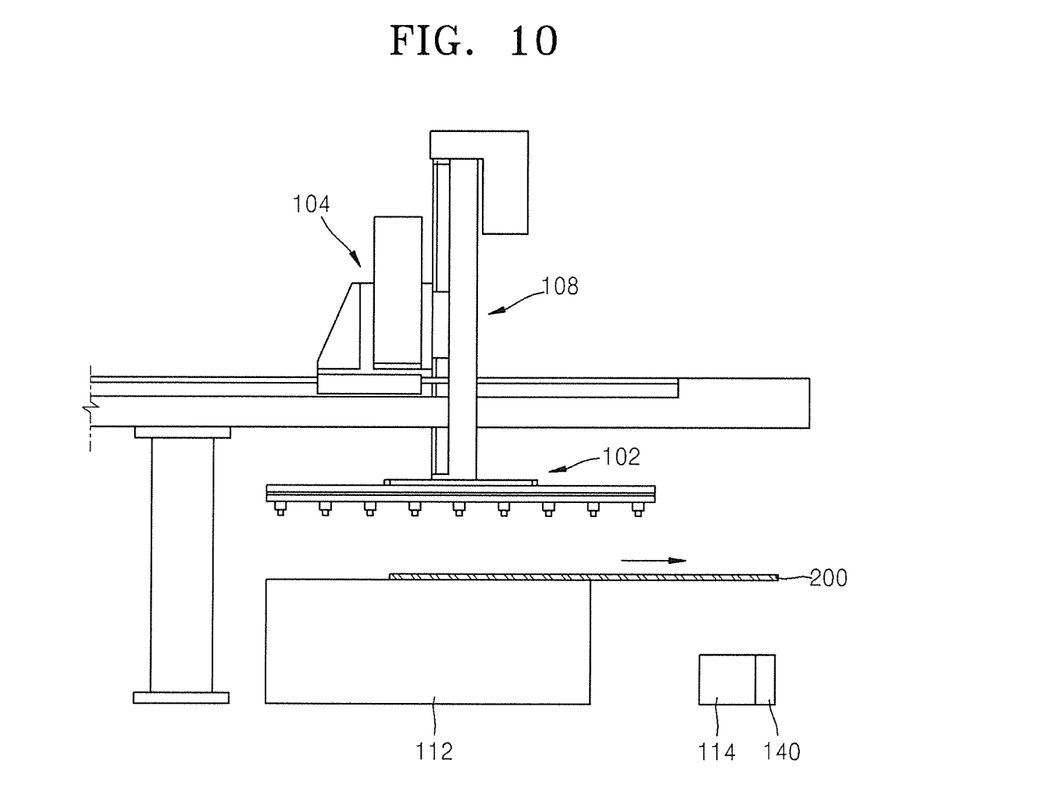

As shown in FIGS. 9 and 10, the carrier substrate 200 is then completely removed from the flexible substrate 210.

Next, the carrier substrate holding unit 102 loads the carrier substrate 200 onto the carrier substrate loading unit 112 by using the transfers 104, 106, and 108 and then returns to its original (e.g., starting) location, and the flexible substrate 210 from which the carrier substrate 200 is removed is conveyed (e.g., transported) along the flexible substrate conveyer 132 to perform post processes.

The transmittance measuring unit 114 measures the transmittance of the carrier substrate 200 loaded on the carrier substrate loading unit 112, and it is determined whether the energy density of the laser used to irradiate the carrier substrate 200 from the laser irradiation apparatus (see, e.g., reference numeral 30 in FIG. 2) is at an appropriate level according to the transmittance measurement result. If the transmittance of the separated carrier substrate 200 is in the normal range, it is determined that the energy density of the laser of the laser irradiation apparatus is appropriate, and the post process of the flexible substrate 210 from which the carrier substrate 200 is removed may be performed.

However, if the transmittance of the separated carrier substrate 200 is in an abnormal range, it may be determined that the carrier substrate 200 and the flexible substrate 210 from which the carrier substrate 200 is removed were overly irradiated by the laser from the laser irradiation apparatus 30 (see, e.g., FIG. 2) so that soot occurs (e.g., soot was produced). Therefore, the flexible substrate 210 having a defect may be discarded without performing the post processes, and thus, the incurrence of unnecessary processing expenses and processing time may be reduced or prevented.

Also, the controller 140 determines (or detects) whether the transmittance measured by the transmittance measuring unit 114 is in the normal range and outputs the measurement result, or transmits the measurement result to the laser irradiation apparatus 30 (see, e.g., FIG. 2) via a wired or wireless communication channel. Also, the controller 140 may control the energy density of the laser via communication with the laser irradiation apparatus 30 (see, e.g., FIG. 2).

Therefore, if an inappropriate transmittance outside of the normal range is measured, the energy density of the laser from the laser irradiation apparatus 30 (see, e.g., FIG. 2) may be controlled in real-time.

Figure 11:
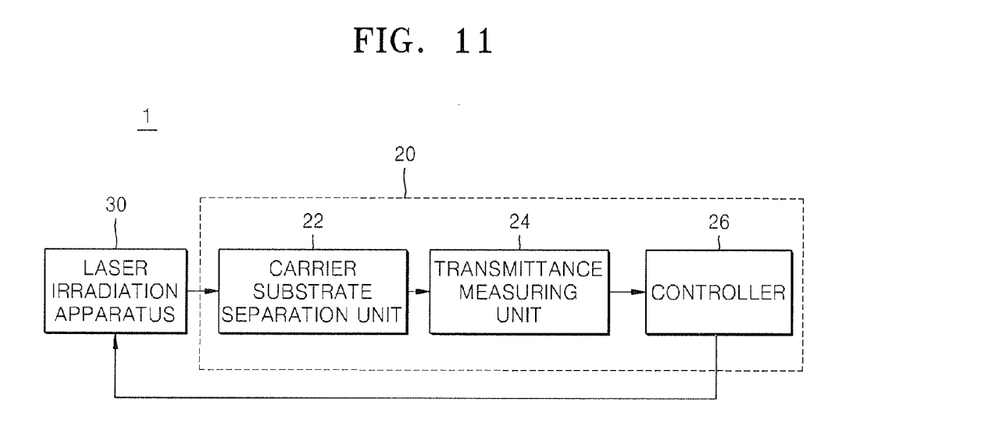
FIG. 11 is a block diagram of a display apparatus manufacturing system according to an embodiment of the present invention.

FIG. 11 is a schematic block diagram showing a display apparatus manufacturing system 1 according to an embodiment of the present invention.

Referring to FIG. 11, the display apparatus manufacturing system 1 includes the laser irradiation apparatus 30 and the carrier substrate removing apparatus 20. The carrier substrate removing apparatus 20 includes a carrier substrate separation unit 22 separating the carrier substrate, a transmittance measuring unit 24 measuring a transmittance of the separated carrier substrate, and a controller 26 comparing the measured transmittance with a reference transmittance to determine (or detect) over-irradiation of the laser and outputting the determination (or detection) result to the laser irradiation apparatus 30.

The laser irradiation apparatus 30 is the same as the above-described laser irradiation apparatus 30 with reference to FIG. 2, and the carrier substrate removing apparatus 20 is the same as the carrier substrate removing apparatus 20 described with reference to FIGS. 4, 5, and 6. Thus, detailed descriptions thereof are not provided here.

Also, the transmittance measuring unit 24 and the controller 26 respectively have the same structures as those of the transmittance measuring unit 114 and the controller 140 shown in FIG. 4, and the carrier substrate separation unit 22 has the structure of the laser irradiation apparatus 20 (see, e.g., FIG. 4) except for the transmittance measuring unit 224 (see, e.g., FIG. 4) and the controller 140 (see, e.g., FIG. 4).

The laser irradiation apparatus 30 allows a flexible substrate and a carrier substrate that are bonded to each other to be separated easily, and irradiates the carrier substrate using a laser beam so that the carrier substrate may be easily separated from the flexible substrate in the carrier substrate separation unit 22.

If the laser irradiation apparatus 30 overly irradiates the carrier substrate with the laser beam, the flexible substrate is damaged and the separated carrier substrate is covered with soot, thereby changing its transmittance.

Therefore, the transmittance measuring unit 24 may measure the transmittance of the separated carrier substrate, and if the measured transmittance is not in a normal range, the controller 26 outputs the result to the laser irradiation apparatus 30, or may control the energy density of the laser via communication with the laser irradiation apparatus 30.

It may be determined in real-time whether the energy density of the laser irradiated from the laser irradiation apparatus 30 is appropriate by the transmittance measuring unit 24 and the controller 26, and thus, unnecessary post processes performed on the flexible substrate that is damaged due to over-irradiation of the laser may be reduced or prevented, and the processing expenses and processing time may be improved (e.g., reduced).

Figure 12:
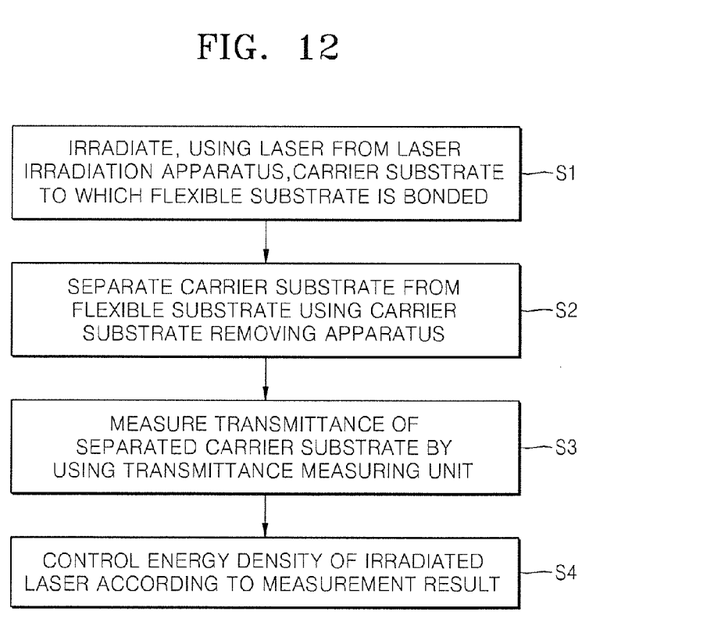
FIG. 12 is a flowchart illustrating a method of manufacturing the display apparatus by using a laser irradiation apparatus and a carrier substrate removing apparatus, according to an embodiment of the present invention.

FIG. 12 is a flowchart illustrating a method of manufacturing a display apparatus by using the laser irradiation apparatus 30 and the carrier substrate removing apparatus 20, according to an embodiment of the present invention.

Referring to FIGS. 11 and 12, the method of manufacturing the display apparatus, according to an embodiment of the present invention, includes irradiating, using a laser beam, a carrier substrate to which a flexible substrate is bonded from the laser irradiation apparatus 30 (S1), separating the carrier substrate from the flexible substrate using the carrier substrate removing apparatus 20 (S2), measuring the transmittance of the separated carrier substrate by using the transmittance measuring unit 24 (S3), and controlling the energy density of the irradiated laser according to (or in accordance with) the measurement result (S4).

It may be determined whether the density of the laser irradiated from the laser irradiation apparatus 30 is at an appropriate level from the measured result of the transmittance measuring unit 24 and the controller 26.

According to the carrier substrate removing apparatus, the display apparatus manufacturing system, and the method of manufacturing the display apparatus of embodiments of the present invention, the following effects may be obtained:

Because defects in the flexible substrate may be detected by measuring the transmittance of the separated carrier substrate, the post processes that might be otherwise be performed on the damaged flexible substrate may be omitted to thus improve (e.g., reduce) the processing expenses and the processing time.

Because the post processes are only performed on the normal flexible substrates, the reliability of the display apparatus may be improved.

Because it may be detected whether the laser is overly irradiated (e.g., supplied at too high a power) according to the transmittance of the carrier substrate, the energy density of the laser may be adjusted and the defect rate of the manufacturing processes may be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims and equivalents thereof.

What is claimed is:

1. A carrier substrate removing apparatus, the apparatus comprising:
    a carrier substrate holding unit configured to hold a carrier substrate after separation from a flexible substrate;
    an inclined separation unit configured, with the carrier substrate holding unit, to separate the flexible substrate from the carrier substrate and to transport the flexible substrate along an angle with respect to the carrier substrate; and
    a transmittance measuring unit configured to measure a transmittance of the separated carrier substrate.

2. The apparatus of claim 1, wherein the transmittance measuring unit comprises an under vision camera or a color determination digital sensor.

3. The apparatus of claim 1, further comprising a controller configured to compare the transmittance measured by the transmittance measuring unit with a reference transmittance range and to output a determination result, the determination result comprising a determination of whether or not the transmittance of the carrier substrate is within the reference transmittance range.

4. The apparatus of claim 3, further comprising a laser irradiation apparatus, wherein the controller is configured to transmit the determination result to the laser irradiation apparatus via a wired or wireless communication channel, the laser irradiation apparatus being configured to irradiate the carrier substrate using a laser beam to separate the carrier substrate and the flexible substrate that are bonded to each other.

5. The apparatus of claim 4, wherein the controller is configured to control an energy density of the laser beam emitted from the laser irradiation apparatus via the wired or wireless communication channel with the laser irradiation apparatus.

6. The apparatus of claim 1, further comprising a carrier substrate loading unit configured to hold the separated carrier substrate.

7. The apparatus of claim 1, wherein the carrier substrate holding unit comprises:
    a carrier substrate holding member configured to hold the carrier substrate by suction holding the carrier substrate; and
    a plurality of transfers connected to the carrier substrate holding member and configured to transfer the carrier substrate holding member.

8. The apparatus of claim 7, wherein the plurality of transfers comprise:
    an X-axis transfer configured to transfer the carrier substrate holding member along an X-axis direction;
    a Y-axis transfer configured to transfer the carrier substrate holding member along a Y-axis direction; and
    a Z-axis transfer configured to transfer the carrier substrate holding member along a Z-axis direction.

9. The apparatus of claim 1, further comprising a plurality of ionizers at opposite sides of the inclined separation unit, the ionizers being configured to spray an anti-electrostatic fluid toward opposite sides of the carrier substrate and the flexible substrate.

10. A display apparatus manufacturing system comprising:
    a laser irradiation apparatus configured to irradiate, using a laser beam, a carrier substrate that is bonded to a flexible substrate;
    a substrate separation unit configured to separate the carrier substrate from the flexible substrate;

a transmittance measuring unit configured to measure a transmittance of the separated carrier substrate; and a controller configured to compare the measured transmittance with a reference transmittance range to determine an over-irradiation of the carrier substrate by the laser beam by using the measured transmittance, and to output a determination result to the laser irradiation apparatus, the determination result comprising a determination of whether or not the transmittance of the carrier substrate is within the reference transmittance range.

11. The system of claim 10, wherein the transmittance measuring unit comprises an under vision camera or a color determination digital sensor.

12. The system of claim 10, wherein the substrate separation unit comprises:

a carrier substrate holding unit configured to hold the carrier substrate separated from the flexible substrate; and an inclined separation unit configured, with the carrier substrate holding unit, to separate the flexible substrate and the carrier substrate from each other and to transport the flexible substrate.

13. The system of claim 10, wherein when the transmittance of the separated carrier substrate is less than a reference value, the controller controls the laser irradiation apparatus to reduce the energy density of the laser.

\* \* \* \* \*